United States Patent
Sugawara

(10) Patent No.: US 8,564,038 B2
(45) Date of Patent: Oct. 22, 2013

(54) NONVOLATILE SEMICONDUCTOR MEMORY DEVICE INCLUDING RESISTIVE ELEMENT

(75) Inventor: Masato Sugawara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 148 days.

(21) Appl. No.: 13/235,411

(22) Filed: Sep. 18, 2011

(65) Prior Publication Data

US 2012/0241835 A1    Sep. 27, 2012

(30) Foreign Application Priority Data

Mar. 23, 2011 (JP) .................. 2011-064926

(51) Int. Cl.
*H01L 27/108* (2006.01)
*H01L 29/76* (2006.01)
*H01L 29/94* (2006.01)
*H01L 31/119* (2006.01)

(52) U.S. Cl.
USPC 257/296; 257/68; 257/E21.17; 257/E21.218; 257/E21.278; 257/E21.304; 257/E21.645; 257/E21.646

(58) Field of Classification Search
USPC .......... 257/68, 296, 396, 310, 314, 315, 316, 257/E21.17, E21.218, E21.278, E21.304, 257/E21.645, E21.646
See application file for complete search history.

(56) References Cited

U.S. PATENT DOCUMENTS

| | | | |
|---|---|---|---|
| 6,274,434 B1 * | 8/2001 | Koido et al. .................. 438/266 |
| 6,925,008 B2 * | 8/2005 | Ichige et al. ............. 365/185.17 |
| 7,416,837 B2 * | 8/2008 | Nozaki et al. ................. 430/314 |
| 7,728,435 B2 * | 6/2010 | Sakuma et al. ............... 257/758 |
| 8,134,201 B2 * | 3/2012 | Toba ............................. 257/324 |

FOREIGN PATENT DOCUMENTS

| JP | 2001-313375 | 11/2001 |
|---|---|---|
| JP | 2009-231445 | 10/2009 |

* cited by examiner

*Primary Examiner* — David Nhu
(74) *Attorney, Agent, or Firm* — Oblon, Spivak, McClelland, Maier & Neustadt, L.L.P.

(57) ABSTRACT

According to one embodiment, a second conductive layer is provided on a second insulating film and connected to a first conductive layer via an opening portion in the second insulating film. A first contact is connected to the second conductive layer. A third conductive layer is provided on the second insulating film and connected to the first conductive layer via an opening portion in the second insulating film. A second contact is connected to the third conductive layer. A fourth conductive layer is provided on the second insulating film and connected to the first conductive layer via an opening portion in the second insulating film. A third contact is connected to the fourth conductive layer. The floating gate layer and the first conductive layer are made of the same material, and the control gate layer, the second, third and fourth conductive layers are made of the same material.

19 Claims, 7 Drawing Sheets

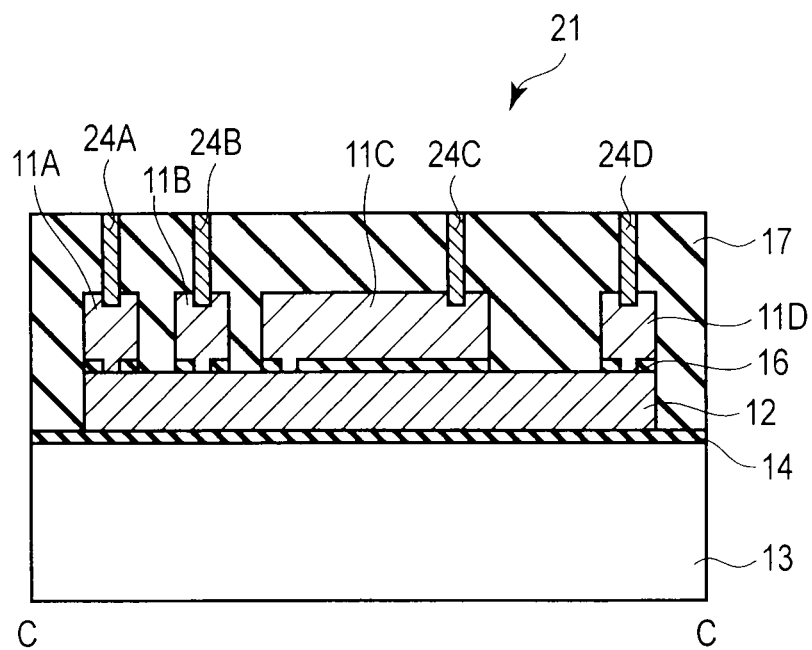
F I G. 3
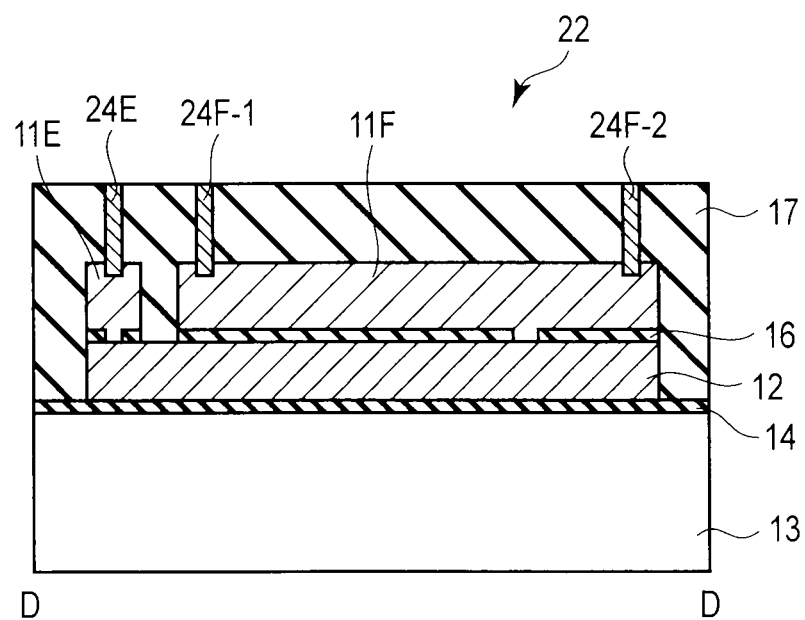
F I G. 4

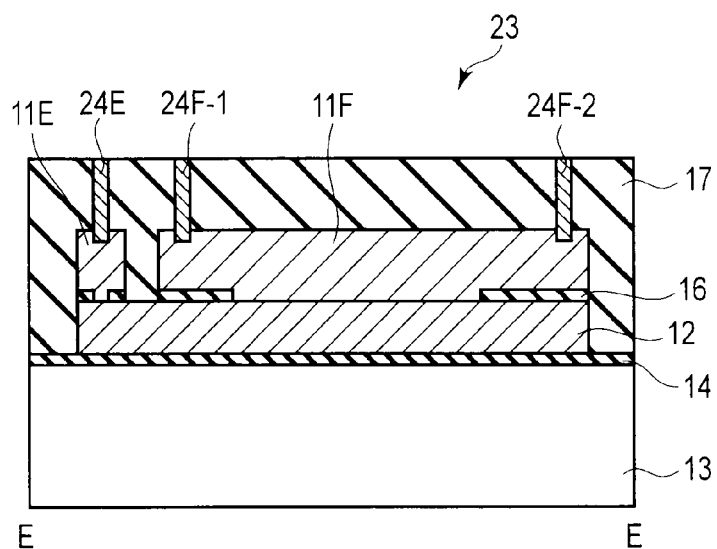
F I G. 5
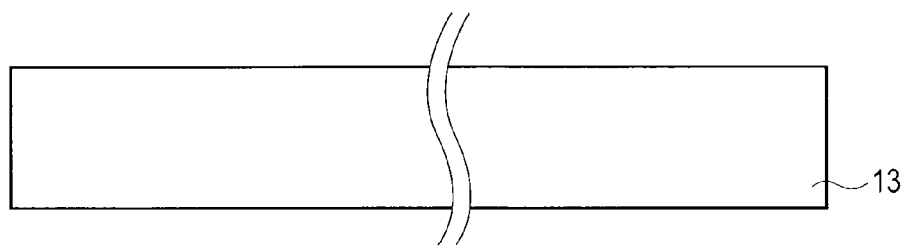
F I G. 6A  F I G. 6B
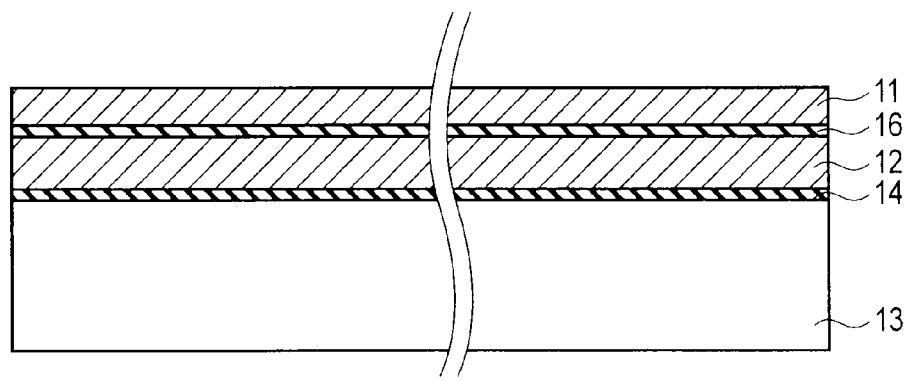
F I G. 7A  F I G. 7B

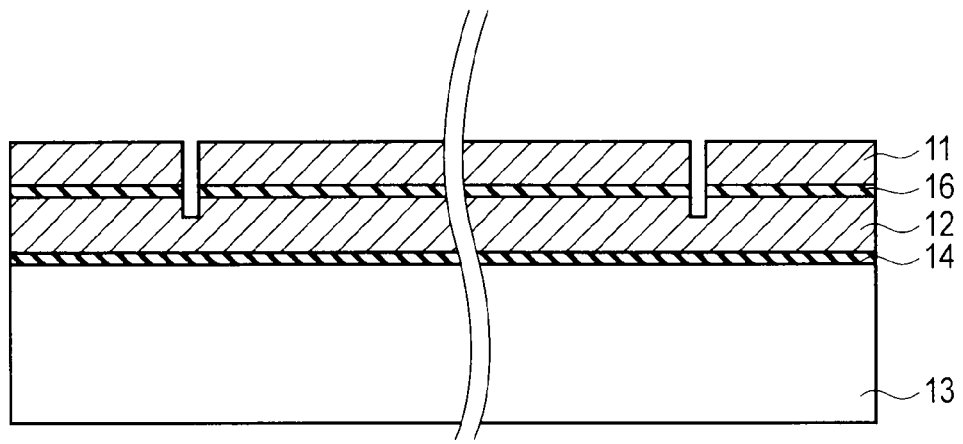
F I G. 8A  F I G. 8B
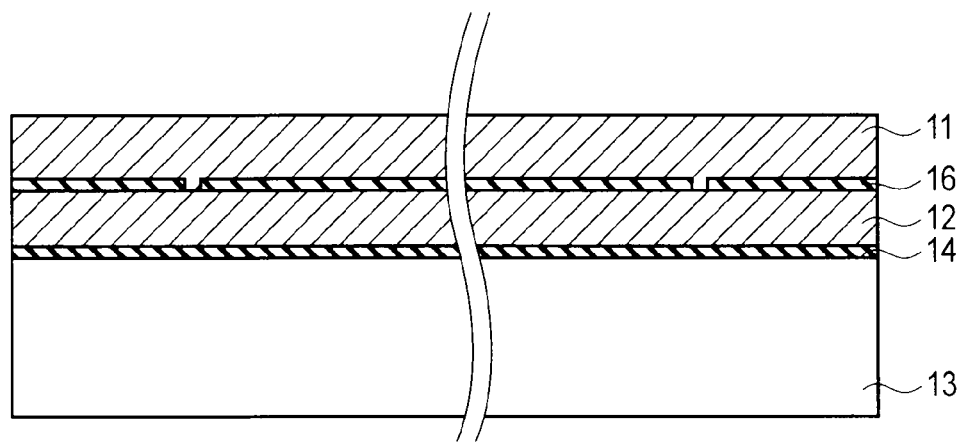
F I G. 9A  F I G. 9B

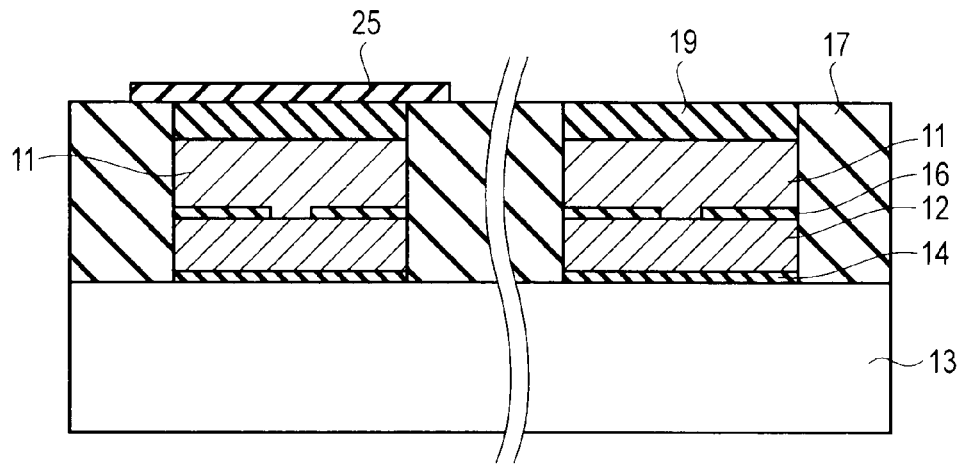
F I G. 12A  F I G. 12B
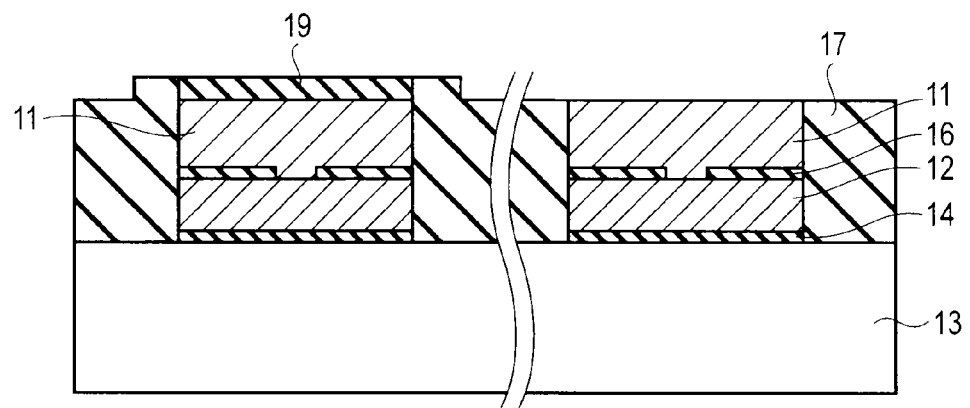
F I G. 13A  F I G. 13B

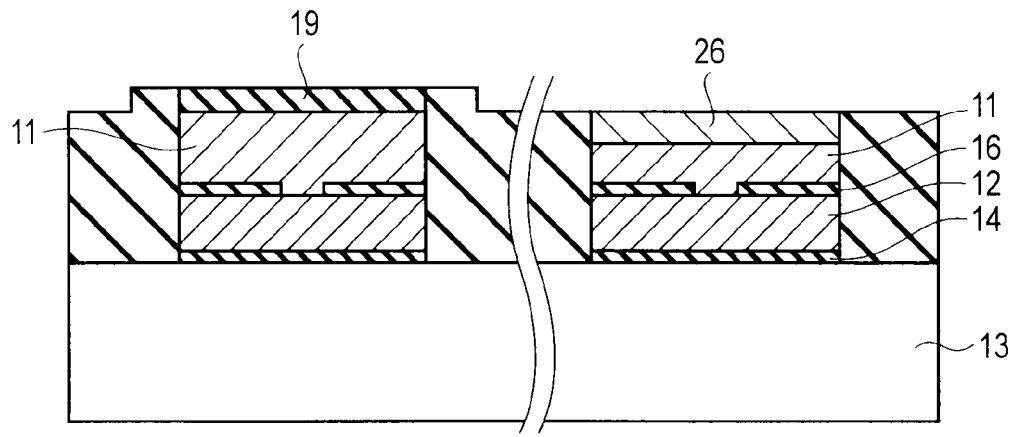
F I G. 14A    F I G. 14B
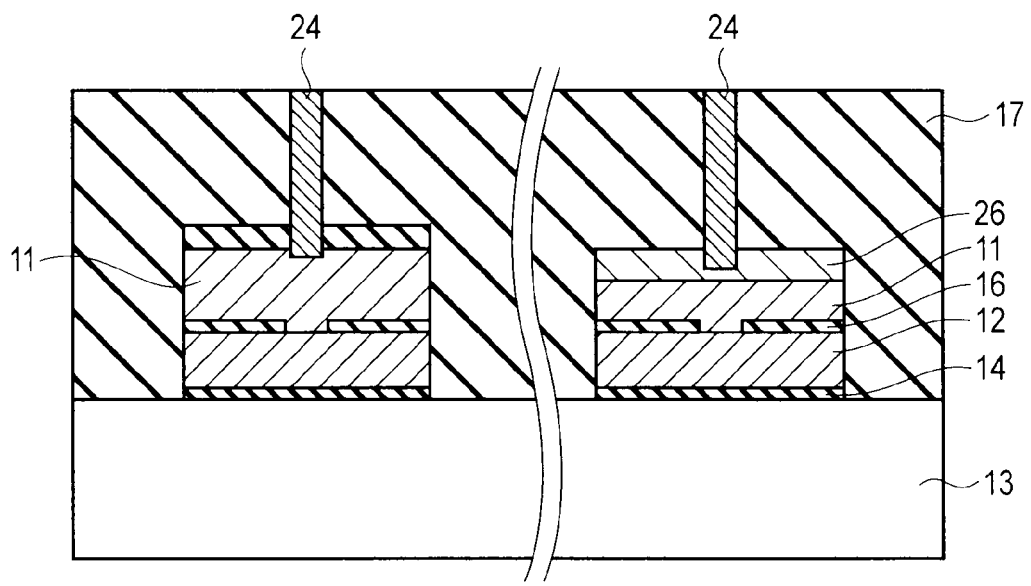
F I G. 15A    F I G. 15B

NONVOLATILE SEMICONDUCTOR MEMORY DEVICE INCLUDING RESISTIVE ELEMENT

CROSS-REFERENCE TO RELATED APPLICATIONS

This application is based upon and claims the benefit of priority from prior Japanese Patent Application No. 2011-064926, filed Mar. 23, 2011, the entire contents of which are incorporated herein by reference.

FIELD

Embodiments described herein relate generally to a nonvolatile semiconductor memory device and, for example, to a NAND flash memory including resistive elements.

BACKGROUND

A nonvolatile semiconductor memory device includes elements such as transistors, diodes, capacitors, and resistors. The elements are prepared in a form based on the film structure of a memory transistor in terms of memory manufacturing process.

The film structure of the memory transistor is formed by sequentially stacking a tunnel oxide film (gate insulating film), a floating gate layer, an inter-gate insulating film, and a control gate layer on a lowermost silicon substrate.

For the resistive element, since the floating gate layer has a relatively high resistance, the length of the floating gate layer is changed, and an interconnection is connected across it, thereby obtaining a desired resistance value. At this time, the control gate layer above the floating gate layer is partially cut in the subsequent process so as to be isolated and not to function as a resistor.

In the above-described resistance obtaining method, however, only the floating gate layer is used as the resistor. For this reason, only one kind of resistance value is obtained in a predetermined layout area, and it is difficult to obtain a plurality of resistance values.

BRIEF DESCRIPTION OF THE DRAWINGS

FIG. 3 is a sectional view of a resistive element 21 provided in a peripheral circuit region according to the embodiment;

FIG. 4 is a sectional view of a resistive element 22 provided in the peripheral circuit region according to the embodiment;

FIG. 5 is a sectional view of a resistive element 23 provided in the peripheral circuit region according to the embodiment;

FIGS. 6A, 6B, 7A, 7B, 8A, 8B, 9A and 9B are sectional views showing a method of manufacturing the resistive element according to the embodiment; and FIGS. 10A, 10B, 11A, 11B, 12A, 12B, 13A, 13B, 14A, 14B, 15A and 15B are sectional views showing a method of manufacturing the resistive element according to the embodiment.

DETAILED DESCRIPTION

Figure 1:
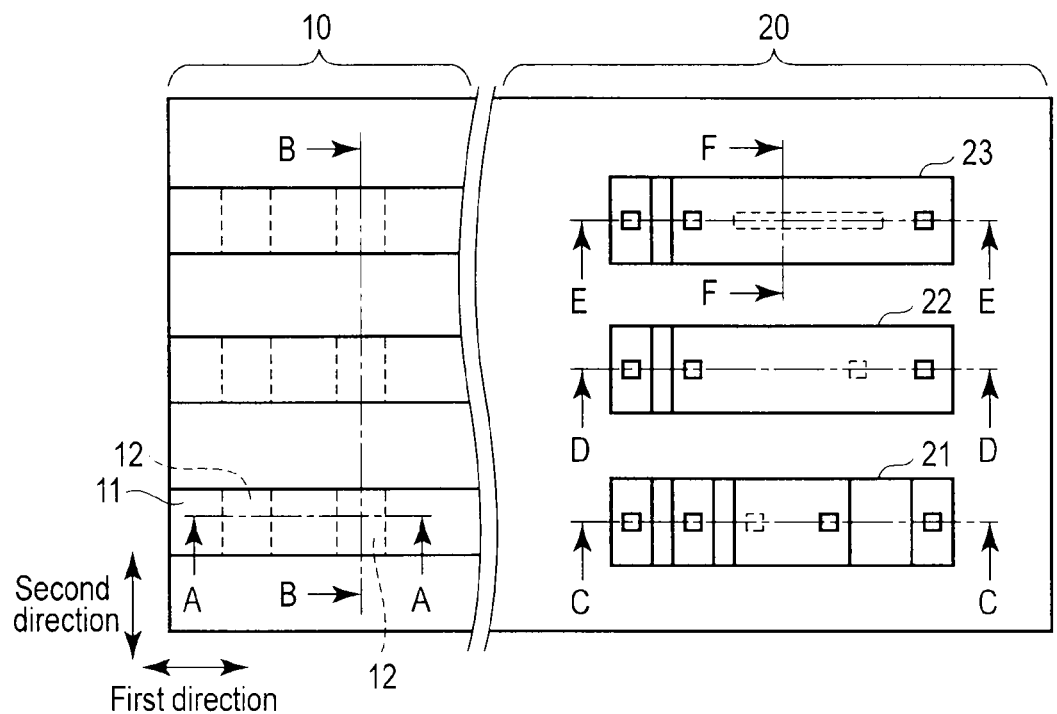
FIG. 1 is a plan view showing the arrangement of a NAND flash memory according to an embodiment.

A nonvolatile semiconductor memory device according to an embodiment will now be described with reference to the accompanying drawing. A NAND flash memory will be exemplified here as the nonvolatile semiconductor memory device. Note that in the following description, the same reference numerals denote constituent elements having the same functions and arrangements, and a repetitive description will be done only when needed.

In general, according to one embodiment, a nonvolatile semiconductor memory device includes a gate insulating film, a floating gate layer, an inter-gate insulating film, a control gate layer, a first insulating film, a first conductive layer, a second insulating film, a second conductive layer, a first contact, a third conductive layer, a second contact, a fourth conductive layer and a third contact. The gate insulating film is provided on a semiconductor substrate. The floating gate layer is provided on the gate insulating film. The inter-gate insulating film is provided on the floating gate layer. The control gate layer is provided on the inter-gate insulating film. The first insulating film is provided on the semiconductor substrate. The first conductive layer is provided on the first insulating film. The second insulating film is provided on the first conductive layer. The second conductive layer is provided on the second insulating film and connected to the first conductive layer via a first opening portion formed in the second insulating film. The first contact is connected to the second conductive layer. The third conductive layer is provided on the second insulating film and connected to the first conductive layer via a second opening portion formed in the second insulating film. The second contact is connected to the third conductive layer. The fourth conductive layer is provided on the second insulating film and connected to the first conductive layer via a third opening portion formed in the second insulating film. The third contact is connected to the fourth conductive layer. The floating gate layer and the first conductive layer are made of the same material, and the control gate layer, the second conductive layer, the third conductive layer, and the fourth conductive layer are made of the same material.

[1] Layout Arrangement

FIG. 1 is a plan view showing the arrangement of a NAND flash memory according to the embodiment.

As shown in FIG. 1, the NAND flash memory (to be referred to as a flash memory hereinafter) comprises a memory cell region 10 and a peripheral circuit region 20. A plurality of memory cell transistors (to be referred to as memory cells hereinafter) are formed in the memory cell region 10. A peripheral circuit configured to perform write, read, and erase for the memory cells is formed in the peripheral circuit region 20. The peripheral circuit includes various kinds of resistive elements. FIG. 1 illustrates three resistive elements 21, 22, and 23.

As shown in FIG. 1, word lines (control gate layers) 11 running in a first direction are arranged in the memory cell region 10. The plurality of word lines 11 are arrayed at a predetermined interval in a second direction perpendicular to the first direction. Floating gate layers 12 are arranged under the word lines 11. The resistive elements 21, 22, and 23 included in the peripheral circuit are arranged in the peripheral circuit region 20.

The structure of the memory cell in the memory cell region 10 will be described first, and the structure of each resistive element in the peripheral circuit region 20 will be described next.

[2] Memory Cell Region

Figure 2A:
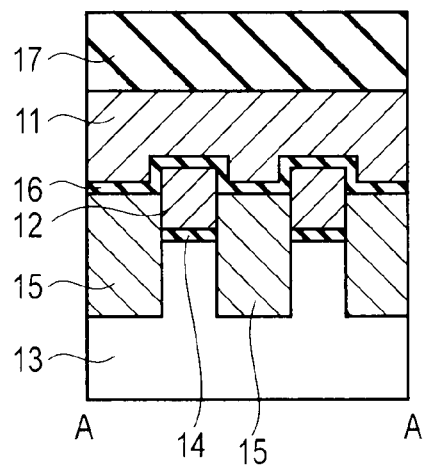
FIGS. 2A and 2B are sectional views of a memory cell region according to the embodiment.
Figure 2B:
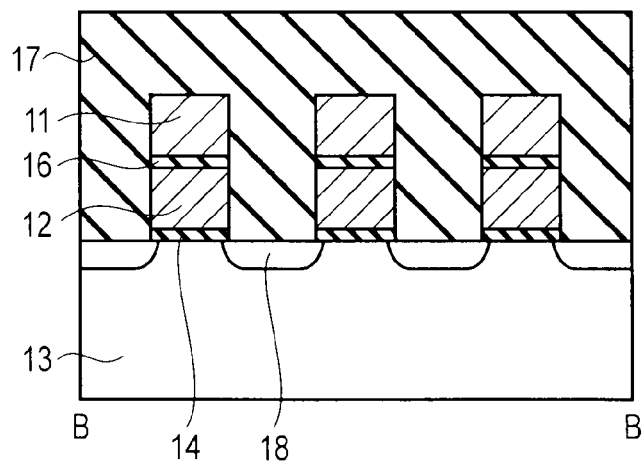

FIGS. 2A and 2B are sectional views of the memory cell region of the NAND flash memory according to the embodiment. FIG. 2A shows the section taken along a line A-A (word line direction) in FIG. 1, and FIG. 2B shows a section taken along a line B-B in FIG. 1.

The memory cell region 10 includes a plurality of NAND cell units. Each NAND cell unit includes a plurality of memory cells connected in series, and a source-side select gate transistor and a drain-side select gate transistor which are respectively connected to the two ends of the series circuit of the plurality of memory cells.

FIG. 2A illustrates memory cells included in two NAND cell units. As shown in FIG. 2A, gate insulating films 14 are formed on the element regions of a semiconductor substrate 13. The floating gate layers 12 are formed on the gate insulating films 14. For example, a polysilicon film is used as the floating gate layer 12. An element isolation region 15 is formed between the semiconductor substrate 13, the gate insulating film 14, and the floating gate layer 12 and those at each adjacent position.

An inter-gate insulating film 16 is formed on the floating gate layers 12. The control gate layer 11 is formed on the inter-gate insulating film 16. The control gate layer 11 is formed from, for example, a stacked film of a polysilicon film and a silicide layer. In addition, an interlayer dielectric film 17 is formed on the control gate layer 11.

FIG. 2B illustrates three memory cells connected in series in a NAND cell unit. As shown in FIG. 2B, the gate insulating films 14 are formed on the element regions of the semiconductor substrate 13. The floating gate layers 12 are formed on the gate insulating films 14.

The inter-gate insulating films 16 are formed on the floating gate layers 12. The control gate layers 11 are formed on the inter-gate insulating films 16. In addition, the interlayer dielectric film 17 is formed on the control gate layers 11.

A source/drain region 18 is formed in the semiconductor substrate 13 between adjacent floating gate layers 12.

[3] Peripheral Circuit Region

The sectional structures of the resistive elements 21, 22, and 23 provided in the peripheral circuit region 20 will sequentially be explained. The resistive elements 21, 22, and 23 are formed using the same materials and the same processes as those of the above-described memory cells in the memory cell region 10. Note that the same reference numerals denote members using the same materials.

(1) Resistive Element 21

FIG. 3 is a sectional view of the resistive element 21 provided in the peripheral circuit region 20 according to the embodiment, and illustrates a section taken along a line C-C in FIG. 1.

As shown in FIG. 3, the first insulating film 14 is formed on the semiconductor substrate 13. The first insulating film 14 is formed using the same material and the same process as those of the gate insulating film 14 in the memory cell region 10.

The first conductive layer 12 is formed on the first insulating film 14. The second insulating films 16 are formed on the first conductive layer 12. The first conductive layer 12 is formed using the same material and the same process as those of the floating gate layer 12 in the memory cell region 10. For example, a polysilicon film is used as the first conductive layer 12. The second insulating films 16 are formed using the same material and the same process as those of the inter-gate insulating film 16 in the memory cell region 10.

A second conductive layer 11A, a third conductive layer 11B, a fourth conductive layer 11C, and a fifth conductive layer 11D are formed on the second insulating films 16 while being separated from each other. Each of the second insulating films 16 between the first conductive layer 12 and the second to fifth conductive layers 11A to 11D has an opening portion. The second to fifth conductive layers 11A to 11D are electrically connected to the first conductive layer 12 via the opening portions.

The second to fifth conductive layers 11A to 11D are formed using the same material and the same process as those of the control gate layer 11 in the memory cell region 10. For example, a stacked film of a polysilicon film and a silicide layer is used for the second to fifth conductive layers 11A to 11D. Note that the second to fifth conductive layers 11A to 11D may be formed using a material and a process partially different from those of the control gate layer 11. For example, the layers may be formed from only a polysilicon film.

In addition, the interlayer dielectric film 17 is formed on the first insulating film 14, the first conductive layer 12, and the second to fifth conductive layers 11A to 11D. The interlayer dielectric film 17 is formed using the same material and the same process as those of the interlayer dielectric film 17 in the memory cell region 10. A contact 24A is formed in the interlayer dielectric film 17 on the second conductive layer 11A. The contact 24A is electrically connected to the second conductive layer 11A. Similarly, contacts 24B, 24C, and 24D are formed in the interlayer dielectric film 17 on the third, fourth, and fifth conductive layers 11B, 11C, and 11D, respectively. The contacts 24B, 24C, and 24D are electrically connected to the third, fourth, and fifth conductive layers 11B, 11C, and 11D, respectively. Note that metal interconnection layers and the like formed on the contacts 24A, 24B, 24C, and 24D are not illustrated.

In the resistive element having the above-described structure, a plurality of conductive layers are used as resistors, thereby forming a plurality of resistive elements. That is, a first resistive element can be formed between the contact 24A and the contact 24B, a second resistive element can be formed between the contact 24A and the contact 24C, and a third resistive element can be formed between the contact 24A and the contact 24D. In addition, a fourth resistive element can be formed between the contact 24B and the contact 24C, and a fifth resistive element can be formed between the contact 24B and the contact 24D.

More specifically, for example, the first resistive element is formed using resistors connected in the order of the contact 24A, the second conductive layer 11A, the first conductive layer 12, the third conductive layer 11B, and the contact 24B. The second resistive element is formed using resistors connected in the order of the contact 24A, the second conductive layer 11A, the first conductive layer 12, the fourth conductive layer 11C, and the contact 24C. The third resistive element is formed using resistors connected in the order of the contact 24A, the second conductive layer 11A, the first conductive layer 12, the fifth conductive layer 11D, and the contact 24D.

The fourth resistive element is formed using resistors connected in the order of the contact 24B, the third conductive layer 11B, the first conductive layer 12, the fourth conductive layer 11C, and the contact 24C. The fifth resistive element is formed using resistors connected in the order of the contact 24B, the third conductive layer 11B, the first conductive layer 12, the fifth conductive layer 11D, and the contact 24D.

The resistive element 21 can use not only the first conductive layer 12 but also the second to fifth conductive layers 11A to 11D on the first conductive layer 12 as the resistors. This allows the resistive element 21 formed in a given area to obtain a plurality of resistance values. Additionally, when a stacked film of a polysilicon film and a silicide layer is used for the second to fifth conductive layers 11A to 11D, resistors having low resistances can be formed. On the other hand, when a polysilicon film is used for the second to fifth conductive layers 11A to 11D, resistors having high resistances can be formed.

That is, in the resistive element 21, using a plurality of conductive layers as resistors enables to obtain higher resistance values or various resistance values in a limited layout area, although impossible in only one conductive layer. It is therefore possible to largely reduce the area necessary for obtaining higher resistance values or various resistance values.

(2) Resistive Element 22

FIG. 4 is a sectional view of the resistive element 22 provided in the peripheral circuit region 20 according to the embodiment, and illustrates a section taken along a line D-D in FIG. 1.

As shown in FIG. 4, the first insulating film 14 is formed on the semiconductor substrate 13. The first insulating film 14 is formed using the same material and the same process as those of the gate insulating film 14.

The first conductive layer 12 is formed on the first insulating film 14. The second insulating films 16 are formed on the first conductive layer 12. The first conductive layer 12 is formed using the same material and the same process as those of the floating gate layer 12. For example, a polysilicon film is used as the first conductive layer 12. The second insulating films 16 are formed using the same material and the same process as those of the inter-gate insulating film 16.

A second conductive layer 11E and a third conductive layer 11F are formed on the second insulating films 16 while being separated from each other. Each of the second insulating films 16 between the first conductive layer 12 and the second and third conductive layers 11E and 11F has an opening portion. The second and third conductive layers 11E and 11F are electrically connected to the first conductive layer 12 via the opening portions.

As in the resistive element 21, the second and third conductive layers 11E and 11F are formed using the same material and the same process as those of the control gate layer 11. For example, a stacked film of a polysilicon film and a silicide layer is used for the second and third conductive layers 11E and 11F. Note that the second and third conductive layers 11E and 11F may be formed using a material and a process partially different from those of the control gate layer 11. For example, only a polysilicon film may be used.

In addition, the interlayer dielectric film 17 is formed on the first insulating film 14, the first conductive layer 12, and the second and third conductive layers 11E and 11F. A contact 24E is formed in the interlayer dielectric film 17 on the second conductive layer 11E. The contact 24E is electrically connected to the second conductive layer 11E. Contacts 24F-1 and 24F-2 are formed in the interlayer dielectric film 17 on the third conductive layer 11F. The contact 24F-1 is arranged on one end of the third conductive layer 11F and electrically connected to the one end of the third conductive layer 11F. The contact 24F-2 is arranged on the other end of the third conductive layer 11F and electrically connected to the other end of the third conductive layer 11F. Note that metal interconnection layers and the like formed on the contacts 24E, 24F-1, and 24F-2 are not illustrated.

In the resistive element having the above-described structure, a plurality of conductive layers are used as resistors, thereby forming a plurality of resistive elements. That is, a first resistive element can be formed between the contact 24E and the contact 24F-1, a second resistive element can be formed between the contact 24E and the contact 24F-2, and a third resistive element can be formed between the contact 24F-1 and the contact 24F-2.

More specifically, for example, the first resistive element is formed using resistors connected in the order of the contact 24E, the second conductive layer 11E, the first conductive layer 12, the third conductive layer 11F, and the contact 24F-1. The second resistive element is formed using resistors connected in the order of the contact 24E, the second conductive layer 11E, the first conductive layer 12, the third conductive layer 11F, and the contact 24F-2. The third resistive element is formed using resistors connected in the order of the contact 24F-1, the third conductive layer 11F, and the contact 24F-2.

The resistive element 22 can use not only the first conductive layer 12 but also the second and third conductive layers 11E and 11F on the first conductive layer 12 as the resistors. This allows the resistive element 22 formed in a given area to obtain a plurality of resistance values. Additionally, when a stacked film of a polysilicon film and a silicide layer is used for the second and third conductive layers 11E and 11F, resistors having low resistances can be formed. On the other hand, when a polysilicon film is used for the second and third conductive layers 11E and 11F, resistors having high resistances can be formed.

That is, in the resistive element 22, using a plurality of conductive layers as resistors enables to obtain higher resistance values or various resistance values in a limited layout area, although impossible in only one conductive layer. It is therefore possible to largely reduce the area necessary for obtaining higher resistance values or various resistance values.

(3) Resistive Element 23

FIG. 5 is a sectional view of the resistive element 23 provided in the peripheral circuit region 20 according to the embodiment, and illustrates a section taken along a line E-E in FIG. 1.

As shown in FIG. 5, the second insulating film 16 has an opening portion larger than that of the second insulating film 16 of the resistive element 22. The third conductive layer 11F is electrically connected to the first conductive layer 12 via the opening portion of the second insulating film 16. That is, the resistive element 23 is different from the resistive element 22 in that the opening portion of the second insulating film 16 is larger than that of the second insulating film 16 of the resistive element 22. The remaining structure is the same as that of the resistive element 22.

In the resistive element 23 having such a structure, a first resistive element can be formed between the contact 24E and the contact 24F-1, a second resistive element can be formed between the contact 24E and the contact 24F-2, and a third resistive element can be formed between the contact 24F-1 and the contact 24F-2, like the resistive element 22.

The opening portion of the second insulating film 16 of the resistive element 23 is larger than that in the resistive element 22. For this reason, the first, second, and third resistive elements of the resistive element 23 have resistance values smaller than those of the first, second, and third resistive elements of the resistive element 22. The remaining effects are the same as in the resistive element 22.

[4] Method of Manufacturing Resistive Element

In the resistive elements 21, 22, and 23, the conductive layers 11A to 11F on the first conductive layer 12 can be either, for example, a polysilicon film, or a stacked film of a polysilicon film and a silicide film, or a single layer of a silicide film, as described above.

The manufacturing methods for forming the conductive layers 11A to 11F using a polysilicon film and for forming them using a stacked film of a polysilicon film and a silicide film will be described below.

FIGS. 6A, 6B, 7A, 7B, 8A, 8B, 9A, 9B, 10A, 10B, 11A, 11B, 12A, 12B, 13A, 13B, 14A, 14B, 15A, and 15B are sectional views showing a method of manufacturing the resistive element according to the embodiment, and illustrate a section taken along a line F-F in FIG. 1. FIGS. 6A, 7A, 8A, 9A, 10A, 11A, 12A, 13A, 14A, and 15A show a case in which the conductive layers 11A to 11F are formed using a polysilicon film (conductive layer) 11. FIGS. 6B, 7B, 8B, 9B, 10B, 11B, 12B, 13B, 14B, and 15B show a case in which the conductive layers 11A to 11F are formed using a stacked film of the polysilicon film (conductive layer) 11 and a silicide film 26.

A first insulating film 14 formed on a semiconductor substrate 13 as shown in FIGS. 6A and 6B by, for example, thermal oxidation, as shown in FIGS. 7A and 7B. Additionally, a first conductive layer 12, a second insulating film 16, and the conductive layer 11 are sequentially formed on the first insulating film 14 by, for example, CVD (Chemical Vapor Deposition).

To form an opening portion in the second insulating film 16, the conductive layer 11 and the second insulating film 16 are etched by, for example, RIE (Reactive Ion Etching), as shown in FIGS. 8A and 8B. Subsequently, the conductive layer 11 is further deposited on the structure shown in FIGS. 8A and 8B, that is, in the opening portion and on the conductive layer 11 by CVD, as shown in FIGS. 9A and 9B.

Figures 10A, 10B:
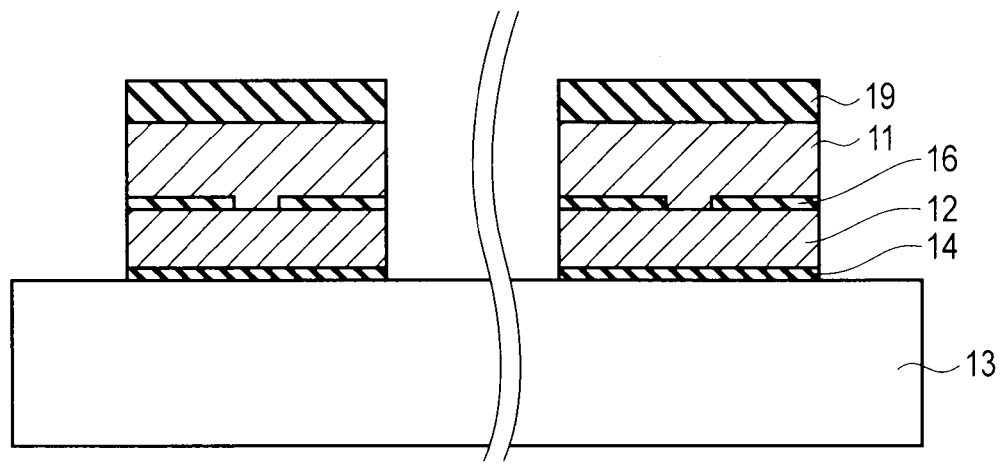

After that, as shown in FIGS. 10A and 10B, the conductive layer 11, the second insulating film 16, the first conductive layer 12, and the first insulating film 14 are etched using, for example, lithography by RIE using a mask member 19 as a protective film, thereby forming the outside shape of the resistive element.

Figures 11A, 11B:
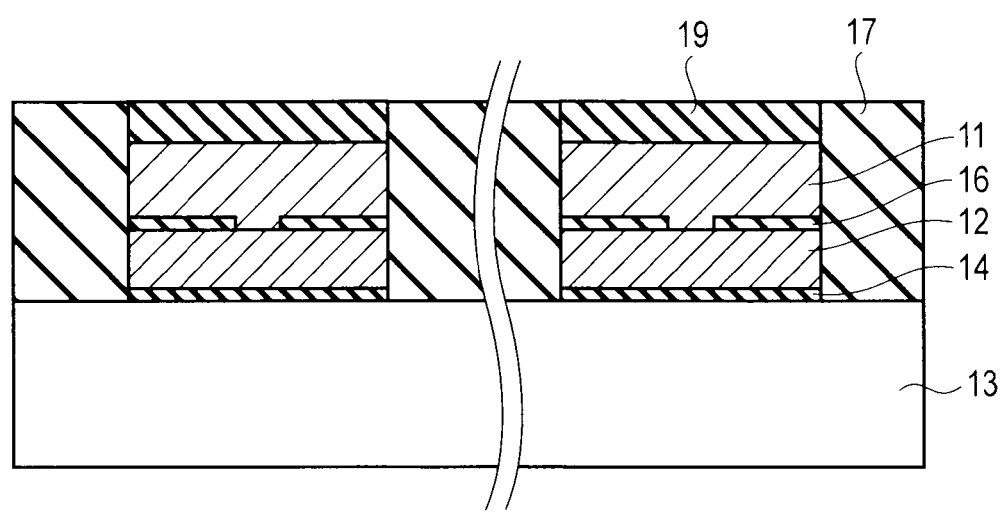

Next, an interlayer dielectric film 17, for example, a silicon oxide film is formed on the semiconductor substrate 13 by, for example, CVD. After that, the interlayer dielectric film 17 is polished by CMP (Chemical Mechanical Polishing) to planarize the interlayer dielectric film 17, as shown in FIGS. 11A and 11B.

After that, a resist film 25 is formed on the mask member 19 and the interlayer dielectric film 17 using lithography, as shown in FIG. 12A. This aims at protecting the surface of the conductive layer 11 shown in FIG. 12A to prevent it from being silicified. At this time, no resist film 25 is formed on the mask member 19 and the interlayer dielectric film 17 shown in FIG. 12B.

As shown in FIG. 13B, the mask member 19 is etched to expose the surface of the conductive layer 11 using, for example, RIE. At this time, the mask member 19 remains on the conductive layer 11 shown in FIG. 13A not to expose the surface of the conductive layer 11.

After that, a metal film is deposited on the conductive layer 11 shown in FIG. 13B. Thermal oxidation is performed to make the conductive layer 11 and the metal film react with each other to form the silicide film 26. The unreacted metal film on the silicide layer 26 is removed then. The conductive layer 11 is thus partially silicified, as shown in FIG. 14B. For example, Ni, Ti, Co, Pt, Pd, Ta, Mo, or the like is used for the metal film.

The interlayer dielectric film 17 is formed on the structures shown in FIGS. 14A and 14B. As shown in FIG. 15A, a contact 24 connected to the conductive layer 11 is formed in the interlayer dielectric film 17 on the conductive layer 11. Similarly, as shown in FIG. 15B, a contact 24 connected to the silicide layer 26 is formed in the interlayer dielectric film 17 on the silicide layer 26.

After that, a metal interconnection and the like are formed on the contact 24. The subsequent processes are not illustrated. The resistive element of this embodiment can be formed by the above-described manufacturing processes. In addition, the structure can selectively be manufactured by forming the conductive layers 11A to 11F using a polysilicon film or a stacked film of a polysilicon film and a silicide film.

As described above, according to the embodiment, it is possible to provide a nonvolatile semiconductor memory device including resistive elements capable of obtaining a plurality of resistance values in a predetermined layout area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a gate insulating film provided on a semiconductor substrate;
a floating gate layer provided on the gate insulating film;
an inter-gate insulating film provided on the floating gate layer;
a control gate layer provided on the inter-gate insulating film;
a first insulating film provided on the semiconductor substrate;
a first conductive layer provided on the first insulating film;
a second insulating film provided on the first conductive layer;
a second conductive layer provided on the second insulating film and connected to the first conductive layer via a first opening portion formed in the second insulating film;
a first contact connected to the second conductive layer;
a third conductive layer provided on the second insulating film and connected to the first conductive layer via a second opening portion formed in the second insulating film;
a second contact connected to the third conductive layer;
a fourth conductive layer provided on the second insulating film and connected to the first conductive layer via a third opening portion formed in the second insulating film; and
a third contact connected to the fourth conductive layer,
wherein the floating gate layer and the first conductive layer are made of the same material, and the control gate layer, the second conductive layer, the third conductive layer, and the fourth conductive layer are made of the same material.

2. The nonvolatile semiconductor memory device according to claim 1, further comprising:
a fifth conductive layer provided on the second insulating film and connected to the first conductive layer via a fourth opening portion formed in the second insulating film; and
a fourth contact connected to the fifth conductive layer,
wherein the control gate layer and the fifth conductive layer are made of the same material.

3. The nonvolatile semiconductor memory device according to claim 1, wherein a first resistive element comprises the first contact, the second conductive layer, the first conductive layer, the third conductive layer, and the second contact, and a second resistive element comprises the first contact, the second conductive layer, the first conductive layer, the fourth conductive layer, and the third contact.

4. The nonvolatile semiconductor memory device according to claim 1, further comprising a silicide layer provided on the control gate layer.

5. The nonvolatile semiconductor memory device according to claim 1, further comprising a silicide layer provided on each of the second conductive layer, the third conductive layer, and the fourth conductive layer.

6. The nonvolatile semiconductor memory device according to claim 1, wherein the gate insulating film and the first insulating film are made of the same material, and the inter-gate insulating film and the second insulating film are made of the same material.

7. The nonvolatile semiconductor memory device according to claim 1, wherein each of the floating gate layer and the first conductive layer includes a polysilicon film.

8. The nonvolatile semiconductor memory device according to claim 1, wherein each of the control gate layer, the second conductive layer, the third conductive layer, and the fourth conductive layer includes a polysilicon film.

9. The nonvolatile semiconductor memory device according to claim 1, wherein a memory cell comprises the gate insulating film, the floating gate layer, the inter-gate insulating film, and the control gate layer, and a resistive element comprises the first conductive layer, the second conductive layer, the third conductive layer, the fourth conductive layer, the first contact, the second contact, and the third contact.

10. The nonvolatile semiconductor memory device according to claim 1, wherein the nonvolatile semiconductor memory device includes a NAND flash memory.

11. A nonvolatile semiconductor memory device comprising:
a gate insulating film provided on a semiconductor substrate;
a floating gate layer provided on the gate insulating film;
an inter-gate insulating film provided on the floating gate layer;
a control gate layer provided on the inter-gate insulating film;
a first insulating film provided on the semiconductor substrate;
a first conductive layer provided on the first insulating film;
a second insulating film provided on the first conductive layer;
a second conductive layer provided on the second insulating film and connected to the first conductive layer via a first opening portion formed in the second insulating film;
a first contact connected to the second conductive layer;
a third conductive layer provided on the second insulating film and connected to the first conductive layer via a second opening portion formed in the second insulating film; and
a second contact and a third contact which are connected to the third conductive layer,
wherein the floating gate layer and the first conductive layer are made of the same material, and the control gate layer, the second conductive layer, and the third conductive layer are made of the same material.

12. The nonvolatile semiconductor memory device according to claim 11, wherein a first resistive element comprises the first contact, the second conductive layer, the first conductive layer, the third conductive layer, and the second contact, and a second resistive element comprises the first contact, the second conductive layer, the first conductive layer, the third conductive layer, and the third contact.

13. The nonvolatile semiconductor memory device according to claim 11, further comprising a silicide layer provided on the control gate layer.

14. The nonvolatile semiconductor memory device according to claim 11, further comprising a silicide layer provided on each of the second conductive layer and the third conductive layer.

15. The nonvolatile semiconductor memory device according to claim 11, wherein the gate insulating film and the first insulating film are made of the same material, and the inter-gate insulating film and the second insulating film are made of the same material.

16. The nonvolatile semiconductor memory device according to claim 11, wherein each of the floating gate layer and the first conductive layer includes a polysilicon film.

17. The nonvolatile semiconductor memory device according to claim 11, wherein each of the control gate layer, the second conductive layer, and the third conductive layer includes a polysilicon film.

18. The nonvolatile semiconductor memory device according to claim 11, wherein a memory cell comprises the gate insulating film, the floating gate layer, the inter-gate insulating film, and the control gate layer, and a resistive element comprises the first conductive layer, the second conductive layer, the third conductive layer, the first contact, the second contact, and the third contact.

19. The nonvolatile semiconductor memory device according to claim 11, wherein the nonvolatile semiconductor memory device includes a NAND flash memory.

* * * * *